United States Patent

Tsai et al.

Patent Number: 5,648,287
Date of Patent: Jul. 15, 1997

[54] METHOD OF SALICIDATION FOR DEEP QUARTER MICRON LDD MOSFET DEVICES

[75] Inventors: Chao-Chieh Tsai, Taichung, Taiwan; Shie-Sen Peng, Los Altos, Calif.

[73] Assignee: Taiwan Semiconductor Manufacturing Company, Ltd., Hsin-Chu, Taiwan

[21] Appl. No.: 729,995

[22] Filed: Oct. 11, 1996

[51] Int. Cl.$^6$ .................................................. H01L 21/265
[52] U.S. Cl. ............................ 437/44; 437/29; 437/34; 437/56; 437/200; 148/DIG. 1; 148/DIG. 3; 257/274
[58] Field of Search ..................... 437/29, 44, 200, 437/34, 56; 148/DIG. 1, DIG. 3; 257/274

[56] References Cited

U.S. PATENT DOCUMENTS

| | | | |
|---|---|---|---|
| 5,322,809 | 6/1994 | Moslehi | 437/44 |
| 5,391,508 | 2/1995 | Matsuoka et al. | 437/44 |
| 5,529,958 | 6/1996 | Yaoita | 437/200 |
| 5,585,295 | 12/1996 | Wu | 437/44 |

*Primary Examiner*—John Niebling
*Assistant Examiner*—Long Pham
*Attorney, Agent, or Firm*—George O. Saile; William J. Stoffel

[57] ABSTRACT

A process for forming a MOS transistor having a salicide structure with a second gate spacers 36 and a source/drain/gate contact pads 32 33. A gate electrode 18 having first sidewall spacers 24 is formed on a substrate. Source and drain regions 28 are formed in the substrate. An amorphous silicon layer is formed over the substrate and patterned leaving the amorphous silicon layer over first sidewall spacers 24 and forming source/drain contact pads 33 over the source/drain regions and gate contact pads 32 over the gate electrode. Nitrogen ions are implanted vertically into the amorphous silicon layer 32 forming a nitrogen rich layer 34. The nitrogen rich layer 34 acts as an oxidation barrier source/drain an gate contact pads. The amorphous silicon layer 28 over the first sidewall spacer is oxidized using the nitrogen rich layer 34 as an oxidation barrier forming second gate spacers 36. A Ti layer is formed over the resultant surface. The substrate is rapid thermal annealed thereby forming titanium silicide 38 on the source/drain/gate contact pads. The contact pads eliminate silicide spiking and leakage. The second spacers eliminate stringer problem (i.e., shorting between the S/D and gate silicide contacts).

25 Claims, 4 Drawing Sheets

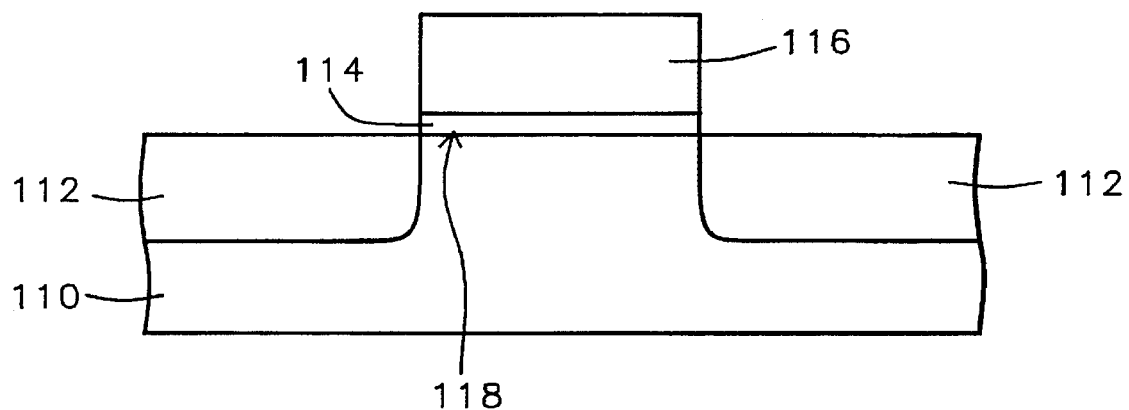
FIG. 1A – Prior Art
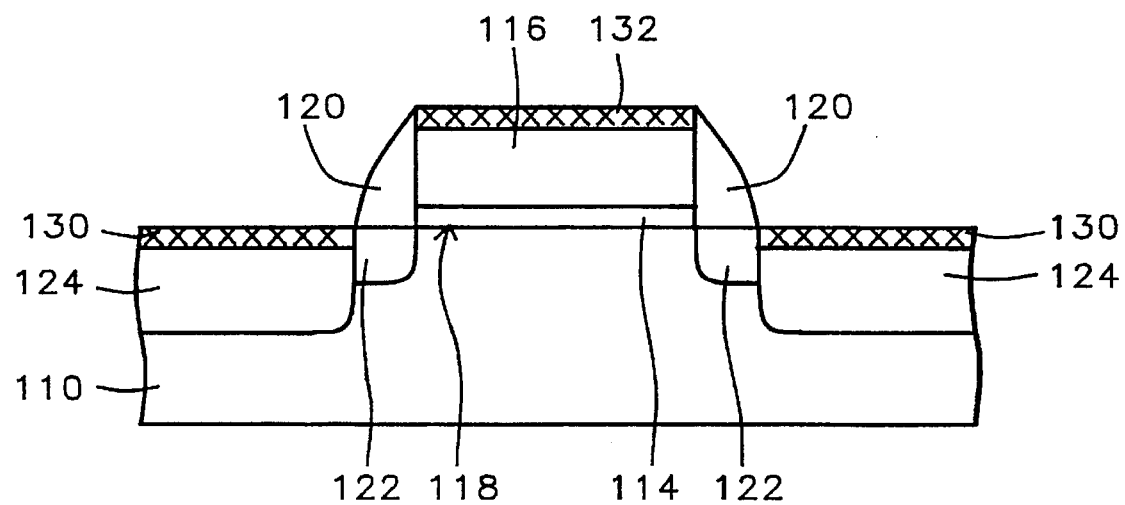
FIG. 1B – Prior Art

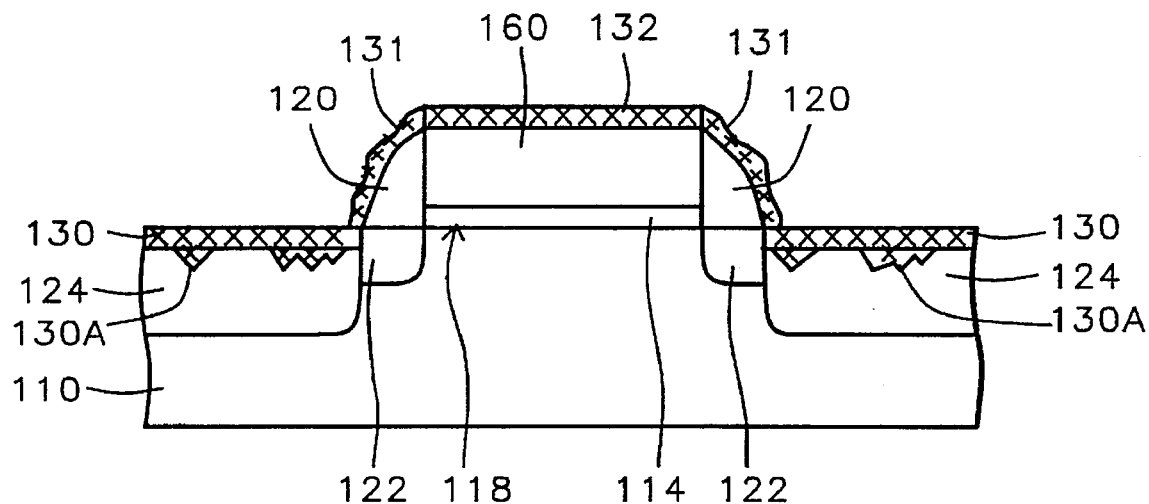
FIG. 1C – Prior Art
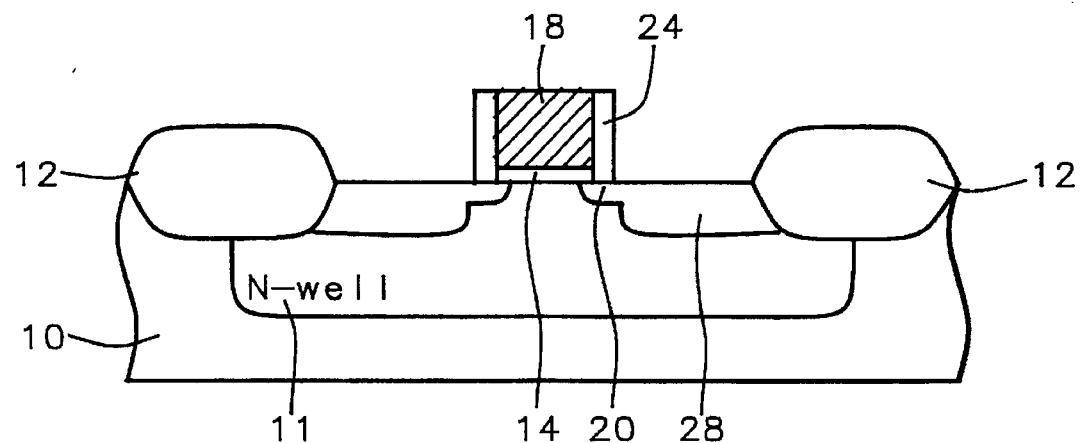
FIG. 2

5,648,287

METHOD OF SALICIDATION FOR DEEP QUARTER MICRON LDD MOSFET DEVICES

BACKGROUND OF THE INVENTION

1) Field of the Invention

The present invention relates to a semiconductor device and a method of manufacturing thereof and, more particularly, to an improvement of a method for manufacturing a metal-insulator-semiconductor (MIS) transistor comprising a salicide structure with a second gate sidewall spacer and source/drain/gate contact pads.

2) Description of the Prior Art

A semiconductor device having a stacked structure of metal-insulator-semiconductor is called a MIS semiconductor device. A transistor using an oxide film as the insulator is especially called a MOSFET (Metal Oxide Semiconductor Field Effect Transistor). FIG. 1A shows a cross sectional structure of a typical MOSFET. The MOSFET comprises a pair of source/drain regions (n type for a N-MOSFET or p-type for a P-MOSFET) 12 on a surface of a silicon substrate 110, a gate oxide film 114 formed on the substrate between the source/drain 112, and a gate electrode 116 formed on the surface of the gate oxide film 114. A N-type MOSFET will be described but P-type MOSFET devices are equally relevant. The surface area of the substrate between the source/drain regions 112 is called a channel region 118. The length of the channel region 118 is distance between the source/drain regions 112.

In operation, a prescribed potential $V_D$ is applied between the source/drain 112. When a gate voltage $V_G$ larger than the threshold voltage $V_{TH}$ is applied to the gate electrode 116, an n type inverted layer where electrons are induced is formed in the channel region 118 for an n-MOSFET. Consequently, a drain current $I_D$ flows between the source and the drain 112. A depletion layer extends around the source and the drain regions 112.

To increase the speed of the transistor, the transistor structure is continuously being made smaller. The MIS transistor is miniaturized by shortening the channel length or forming source/drain regions having a shallow junction in accordance with a scaling rule in principle. However, two difficulties occur when making the transistor smaller, especially making the channel length shorter. First, short channel effects due to the shortening of the channel of the transistor becomes problematic. Because of the short channel effect, a breakdown phenomenon, and a hot electron effect are generated in the vicinity of the drain, so that reliability is decreased and the transistor performance is degraded. One of the short channel effects is the hot electron effect. A strong electric field is generated near the drain of a MISFET (MOSFET) having a short channel. Electrons introduced to this strong electric field region generate hot carriers by impact ionization. Some of the generated hot carders are caught by traps in the gate oxide film 114 of the MOSFET and are accumulated as time passes. The accumulated carders cause changes of the threshold voltage $V_{TH}$ with time and deterioration of mutual conductance, significantly reducing the reliability of the MOSFET.

The second difficulty encountered when miniaturizing the MOSFET transistor is that the wiring resistance of the source/drain impurity diffusion layer and gate electrode layer increase thereby reducing the transistor speed. At the source/drain regions, the resistance is increased as the junction depth becomes shallower and the conductive area becomes smaller. At the gate electrode, the resistance is increased as the gate length becomes shorter and the conductive area becomes smaller. Because of the increase in wiring resistance, the high speed responsiveness of the transistor is degraded.

As a structure for addressing these difficulties, a lightly doped drain (LDD) structure was adopted to prevent the short channel effect and, in addition, as a structure for preventing the increase in wiring resistance, a salicide structure was proposed. FIG. 1B is a diagram of a conventional MIS transistor having such structure. A n-type FET device is described below but p-type devices are also possible.

Referring to the FIG. 1B, a gate electrode 116 comprising polysilicon is formed on a silicon substrate 110 over a gate oxide film 114. Sidewall spacers 120 serve as insulating films are formed on either side of the gate electrode 118. N<-> impurity regions (i.e., lightly doped source/drain regions) 122 with low concentration are formed at a self-aligning position with the gate electrode 116 on the p type silicon substrate 110 or well. In addition, n<+> impurity regions (i.e., highly doped source/drain regions) 124 with high concentrations are formed at a self-aligning position with the sidewall spacers 120. Each n<-> impurity region 122 and n<+> impurity region 124 constitutes a source and drain region 122 124 of the transistor. In addition, a structure of the impurity region having a structure in which the positions of the n<-> impurity region 122 with low concentration and the n<+> impurity region 124 with high concentration are offset is referred to as a lightly doped drain (LDD) structure.

Also, silicide layers 130 comprising titanium silicide are formed on the upper surface of the gate electrode 116 and the surface of the highly doped source/drain regions 24. The structure of the silicide layers 130 132 that are formed in a self-alignment manner on the gate electrode 116 and the highly doped source/drain regions 124 is referred to as a "salicide structure".

The lightly doped source/drain impurity regions 122 constituting the LDD structure are positioned such that the impurity concentration distribution between the highly doped source/drain regions 124 and a channel region 118, just beneath the gate electrode 116, may be made gently sloping. As a result, the electric field concentration, particularly on the side of the drain region, is mitigated and the generation of the breakdown phenomenon and hot carriers are restrained.

In addition, the silicide layers 130 132 constituting the salicide structure have a higher conductivity. The wiring resistance of the gate electrode 116 and the sheet resistance of the source/drain regions 122 124 are reduced.

Referring to FIG. 1B, a description is made of manufacturing steps of the conventional LDD MOS transistor. A thin gate oxide film 114 is formed on a p type silicon substrate 110. Then, a polysilicon layer is formed on the surface of the gate oxide film 114 to form a gate electrode 116 by patterning the gate oxide film 114 and the polysilicon layer. N type impurity ions are implanted on the p type silicon substrate 110 with a small dosage using the gate electrode 116 as a mask to form n<-> impurity regions 122 and 22.

Next, a silicon oxide film of the thickness approximately equal to about 2500 Angstrom is formed on the p type silicon substrate 110 on which the gate electrode 116 was formed. Then, sidewall spacers 120 are formed on either side of the gate electrode 116 by anisotropic etching the silicon oxide film. Next, the n type impurity ions are implanted into the p type silicon substrate 110 with a large dosage using these sidewall spacers 120 and the gate electrode 116 as a mask to form highly doped source drain regions 24.

A refractory metal layer, such as titanium, is evaporated on the surface of the silicon substrate 110, the gate electrode 116, and the sidewall spacers 120. Thereafter, high temperature heat treatment is performed and the refractory metal layer is made to react with the polysilicon layer of the gate electrode 116 and source/drain regions 130 in contact with the refractor metal layer to form a silicide layer.

Next, the unreacted refractory metal layer evaporated on the surface of the sidewall spacers 120 is removed. Silicide layers 130 132 are formed in a self-alignment manner on the surface of the gate electrode 116 and the highly doped source drain regions 124.

The sidewall spacers 120 fulfill two functions. First, they function as a mask to selectively form the silicide layer of the refractory metal layer. Theoretically, the sidewall spacers are not supposed to react with the refractory metal layer 130 132. The silicide regions on the top surface of the gate electrode 132 and on the source/drain regions 130 are separated by the sidewall spacer and self-aligned.

However, as shown in FIG. 1C, with the conventional process, silicon can diffuse over the spacers 120 from the source/drain regions 124 and the gate electrode 116. The diffused silicon will react with the titanium over the spacers 120, thus forming a titanium silicide bridge (stringer) 131 over the spacers 120. This titanium silicide formation over the spacers is called a "stringer" or "bridging problem". The bridging problem reduces device yields by electrically shorting the source/drain 124 to the gate electrode 116. The silicide rapid thermal anneal must be tightly controlled to minimize the silicon diffusion which causes the stringer 131 or bridge formation.

Second, the sidewall spacer 120 functions to define the offset length of the n<−> impurity region 122 and n<+> impurity region 124 of the source and drain region. That is, the length of the n<−> impurity region 122 is substantially defined by the film thickness of this sidewall spacer 120. However, in practice the minimum thickness of the sidewall spacer 120 is limited by the requirement to separate the silicide regions 130 132, so the minimum length of the lightly doped source/drain region 122 is also limited. In the conventional process, the minimum sidewall spacer thickness is determined largely by the rapid thermal anneal temperature and times, i.e., the higher temperature and longer the anneal, the thicker the spacer must be.

As semiconductor technology reaches the quarter micron device size, two major problems are encountered using the conventional silicide process—(1) silicide spiking and leakage in shallow source/drain regions and (2) silicide stringers/ bridging. First, to increase transistor speed, the distance between the source/drain and gate regions must be reduced, but at the same time the silicide layers 130 and 132 must be electrically isolated (not shorted together). By reducing the distances, the parasitic resistance of the lightly doped source/drain is reduced, thus increasing the transistor speed. However, a reliable simple manufacturing process must be developed that further reduce transistor size while ensuring that the silicide bridge problem 131 does not short out the source/drain 124 to the gate electrode 116.

The second problem with 0.25 μm technology is that the source/drain junction depth must be reduced to improve short channel effects. However, salicidation causes severe silicon substrate consumption in S/D areas (e.g., spiking 130A in FIG. 1C), resulting in junction leakage. There is a need to develop a process that prevent silicide spiking will allowing for shallow source/drain regions and low resistance silicide contacts.

SUMMARY OF THE INVENTION

It is an object of the present invention to provide a method of forming a miniaturized semiconductor device having titanium silicide contacts to the gate electrode and source/ drain regions electrically isolated.

It is a further object of the present invention to provide a method of forming a lightly doped drain MOS transistor which prevents silicon from diffusing over the sidewall spacers and short the titanium silicide layer between the gate electrode and the source/drain regions.

It is yet another object of the present invention to provide a method of forming a salicide structure on a lightly doped drain (LDD) MOS transistor which forms second gate sidewall spacers which prevent shorts (stringers) between the silicide of the gate electrode and the source/drain regions.

It is another objective of the present invention to provide a method of forming titanium silicide source/drain/gate contact pads which allows a larger silicide thermal anneal process window thus allowing more conductive titanium silicide contacts to be formed.

It is yet another object of the present invention to provide a method of forming source/drain and gate silicide contact pads that do not have spiking or leakage problems.

In accordance with the above objectives a process is provided for forming a MOS transistor having a salicide structure with second gate sidewall spacers and polysilicon contact pads. The method begins by forming a gate insulating layer 14 on the surface of a semiconductor structure 10 comprising a substrate. A polysilicon layer is formed on the gate insulating layer. The polysilicon layer is patterned into a gate electrode 18 having vertical sidewalls and a top surface.

Impurities are introduced into the semiconductor substrate using the gate electrode as a mask to form lightly doped source/drain regions 20. A first insulating layer is formed on the surface of the semiconductor substrate and on the gate electrode. The first insulating layer is anisotropically etched to form first sidewall spacers 24 on the sidewalls of the gate electrode 18. Impurity ions are implanted into the semiconductor substrate using the gate electrode and the first sidewall spacers as a mask to form an highly doped source/drain regions 28. The substrate is rapidly thermal annealed to activate the highly doped source/drain regions 28.

An amorphous silicon layer 32 is formed over the resultant surface. The amorphous silicon layer 32 is then a patterned leaving the amorphous silicon layer the sidewalls of the sidewall spacers 24, and forming source/drain contact pads and gate contact pads. Nitrogen ions are implanted vertically into source/drain contact pads and gate contact pads. The nitrogen ions build up on the surface of source/ drain contact pads and gate contact pads forming a nitrogen rich layer 34. The nitrogen rich layer 34 acts as an oxidation barrier over the gate electrode and the highly doped source/ drain regions. The nitrogen rich layer 34 is not formed on the vertical sidewalls over the gate sidewall spacers because the vertical $N_2$ implant does not strike this area.

The amorphous silicon layer 28 is oxidized using the nitrogen rich layer 34 as an oxidation barrier forming a second gate spacers 36 composed of silicon oxide over the sidewalls of the first gate sidewall spacers 24, and forming an oxynitride layer 37 over the gate electrode and the highly doped source/drain region 28.

The oxynitride layer is then removed from the amorphous silicon layer. A titanium layer is deposited over the resultant surface. The substrate is rapid thermal annealed thereby forming titanium silicide contacts 38 on the contact pads over the gate electrode and over the highly doped source/drain regions. The remaining unreacted titanium layer, especially over the second spacer 36, is removed. The substrate is rapid thermal annealed to form a salicide structure.

The present invention provides a method of forming a silicide structure that eliminates stringers (e.g., shorting between Source/drain regions and gate contacts) and silicide spiking in source/drain regions. The contact pads (amorphous silicon layer) over the source/drain and gate provide a low resistance silicide contact while preventing spiking and leakage current in the shallow source/drain regions. Second, the second sidewall spacer 36 (double spacer) prevents stringers from shorting between the S/D and gate. The oxidation that forms the second spacer consumes the available polysilicon on the sidewalls of the gate, thereby preventing silicide stringers from forming on the gate sidewalls. Also, the second spacers lengthen the distance the silicide would have to cover to create a short. The present invention improves the process window of contact hole etching. The present invention reduces the "narrow line effect" of Ti Silicide where it becomes difficult to form silicide in lines less than 0.45 µm.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1A shows a cross sectional view of a MOS transistor of the prior art.

FIG. 1B shows a cross sectional view of a lightly doped drain (LDD) MOS transistor of the prior art.

FIG. 1C shows a cross sectional view of a LDD MOS transistor of the prior art having the shorted silicide bridge problem.

FIGS. 2 through 6 show the process of the present invention for forming second sidewall spacers and S/D/Gate contact pads for a silicide structure.

DETAILED DESCRIPTION OF THE PREFERRED EMBODIMENTS

Figure 3:
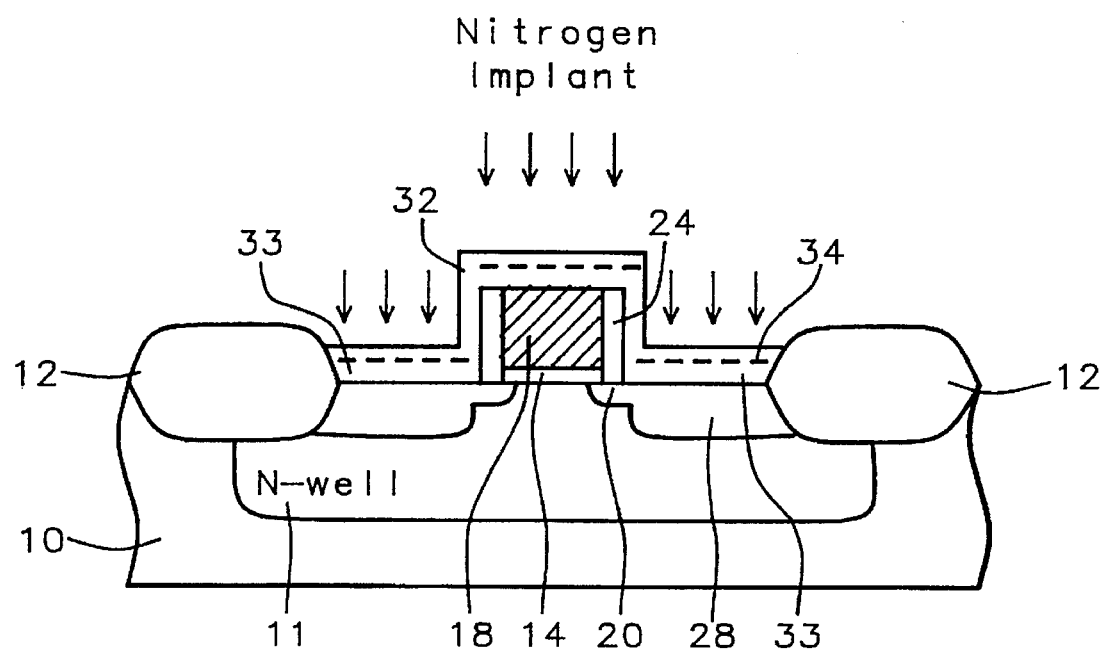
Figure 4:
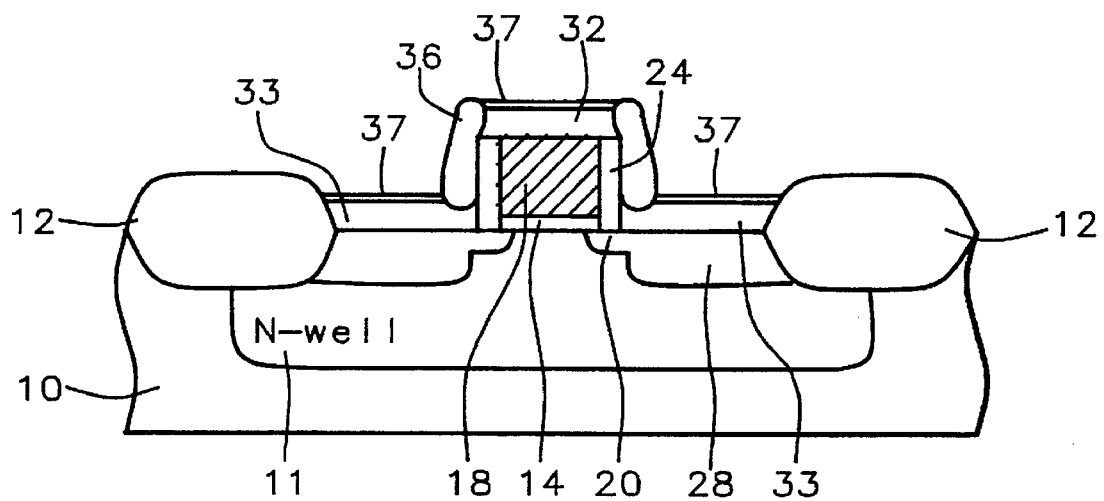

According to the present invention a method of manufacturing a semiconductor device (e.g., MOS transistor) having a salicide structure with a second gate sidewall spacers 36 and contact pads 32 33 is provided. The present invention will be described in detail with reference to the accompanying drawings. It should be noted that the drawings are in greatly simplified form. In practice the semiconductor device structure will be one of many supported on a common substrate connected with suitable metallurgy in various electronic electric circuit configurations. It should be noted that a p-type MOS transistor in a n-type well or substrate is described but the invention is applicable to opposite conductivity type devices (i.e., NMOS).

The salicide structure of the invention is formed over a semiconductor structure 10 comprising a semiconductor substrate and devices formed in and on the substrate. The structure can comprise N and P wells, field oxide regions, sources and drain regions and insulating and conductive layers formed over the substrate.

The transistor shown in FIG. 2 is a PMOS transistor with a P+ source/drain (S/D) and gate regions. The substrate 10 is P type and a N well 11 is shown under the active areas. However, opposite type MOS transistors and devices can be formed using the invention.

The substrate shall be a monocrystalline silicon semiconductor body with many devices fabricated therein, as is well known in the art. The substrate is preferably formed of monocrystalline silicon preferably having a crystalline orientation of <100>. The background substrate dopant is of first conductivity type, and preferably p -type, preferably with Boron impurity with a concentration in the range of 5E15 to 5E17 atoms/cm$^3$.

A gate insulating layer 14 is formed on the surface of a semiconductor substrate 10. The gate insulating layer 14 is preferably formed of silicon oxide. The gate insulating layer preferably has a thickness in the range of about 100 to 200 Å.

Next, a first polysilicon layer is formed on the gate insulating layer. The polysilicon layer and gate insulating layer are patterned into a gate electrode 18 having vertical sidewalls and a top surface. The polysilicon layer can be doped with an impurity by an in situ doping process or by an ion implant process. The polysilicon layer preferably has a P conductivity type and a concentration in a range of between about 1E20 and 4E20 atoms/cm$^3$. The gate electrode 18 preferably has a height (thickness) in a range of between about 2000 and 3000 Å.

Still referring to FIG. 1, impurity ions are introduced into the semiconductor substrate using the gate electrode 18 as a mask to form lightly doped source/drain regions 20. The ions can be boron or BF$_2$ and can be implanted at a dose between about 2E13 to 4E13 atom/sq. cm. and at an energy of about 50 to 70 Kev. The lightly doped source/drain regions 24 can have a concentration in the range of about 2E17 to 7E17 ions/cc. The S/D implant also preferably implants the gate electrode 18.

A first insulating layer (not shown) is formed on the surface of the semiconductor substrate and over the gate electrode. As shown in FIG. 2, the first insulating layer is anisotropic etched to form sidewall spacers 24 on the sidewalls of the gate electrode 18. The first insulating film can be formed of Tetraethylorthosilicate (TEOS) silicon oxide, silicon nitride or silicon oxide and is more preferably formed of silicon oxide formed by a chemical vapor deposition process. The first gate sidewall spacers 24 preferably have a thickness in the range of about 1500 to 3000 Å.

Next, impurity ions are implanted into the semiconductor substrate using the gate electrode 18 and the first gate sidewall spacers 24 as a mask to form an highly doped source/drain regions 28. The substrate is then thermal annealed to activate the highly doped source/drain regions 28. The thermal anneal preferably is performed at a temperature in a range of between about 980° and 1050° C. for a time in a range of between about 10 and 60 seconds.

An amorphous silicon layer 32 is then formed over the resultant surface and preferably has a thickness in a range of between about 30 nm and 80 nm and more preferably about 50 nm. Amorphous silicon is preferably used because it enhances the subsequent silicidation.

The amorphous silicon deposition process is can be carried out under conditions of either: (a) in an atmosphere of $SiH_4$, a pressure between about 0.1 to 10 torr, at a temperature in the range between about 360° to 560° C. or (b) in an atmosphere of $Si_2H_6$, a pressure of in the range between about 0.1 to 1 torr, at a temperature in the range between about 500° to 560° C. Also, the amorphous layer can be formed by a conventional low temperature deposition and/or anodic process. For example, amorphous silicon can be deposited from the decomposition of silane $SiH_4$ in a hot wall vertical LPCVD reactor, at a pressure of about 0.2 torr and a temperature of about 530° to 560° C.

The amorphous silicon layer 32 is then a patterned leaving the amorphous silicon layer over the highly doped source/drain regions 28, the sidewalls of the sidewall spacers 24, and over the gate electrode 18. The amorphous silicon layer over the highly doped source/drain regions 28 is called source/drain (S/D) contact pads 33. The amorphous silicon layer over the gate electrodes 18 is called gate contact pads 32.

As shown in FIG. 3, nitrogen ions are then implanted vertically into the amorphous silicon layer 32. The nitrogen ions build up on the surface of the amorphous silicon layer 32 and form nitrogen rich layer 34. The nitrogen rich layer 34 is not formed on the vertical sidewalls over the gate sidewall spacers because the vertical $N_2$ implant does not strike this area. The nitrogen rich layer 34 acts as an oxidation barrier over the gate electrode 18 and the highly doped source/drain regions 28. The nitrogen ion are preferably implanted at an energy between about 30 and 70 and a dose between about 1E15 and 3E15 ions/sq. cm. The nitrogen rich layer 32 preferably has thickness in a range of between about 80 and 120 Å. The nitrogen rich layer preferably has a $N_2$ concentration in a range of between about 5E19 and 2E20 atoms/cm$^3$.

The amorphous silicon layer 28 is oxidized forming second gate sidewall spacers 36 composed of silicon oxide over the sidewalls of the first spacer 24. Also, the oxidation forms an oxynitride layer 37 over $N_2$ rich layer 34 over the gate/source/drain contact pads 32 33. The oxidation completely consumes the exposes amorphous silicon layer on the first spacers thereby preventing stringers form being formed over the first and second spacers. The oxidation is preferably a low temperature plasma oxidation performed a temperature in a range of between about 500° and 600° C. and a pressure in a range of between about 0.05 and 0.5 torr and for a time in a range of between about 50 and 150 minutes.

The second spacer 36 preferably has a width in a range of between about 750 and 2000 Å and a height in a range of between about 2000 and 3000 Å. The oxynitride layer 37 preferably has a thickness in a range of between about 30 and 100 Å.

The oxynitride layer 37 is then removed from the amorphous silicon layer. The oxynitride layer is preferably removed by a selective wet etch such as $H_3PO_4$ and HF.

Figure 5:
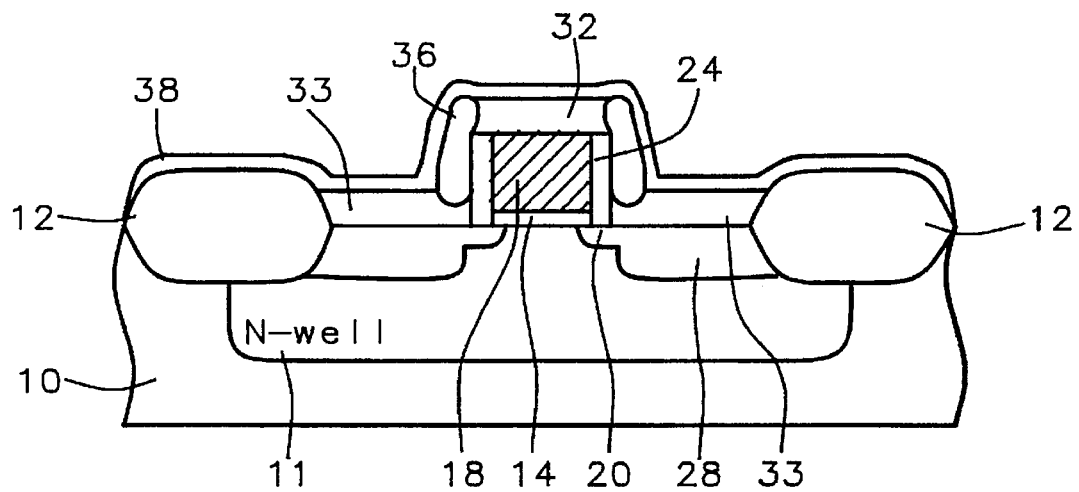

As shown in FIG. 5, a titanium layer 38 is deposited over the resultant surface. The titanium layer 38 can be sputter deposited using a conventional sputter process. The titanium layer 38 preferably has a thickness in a range of between about 200 and 400 Å.

Figure 6:
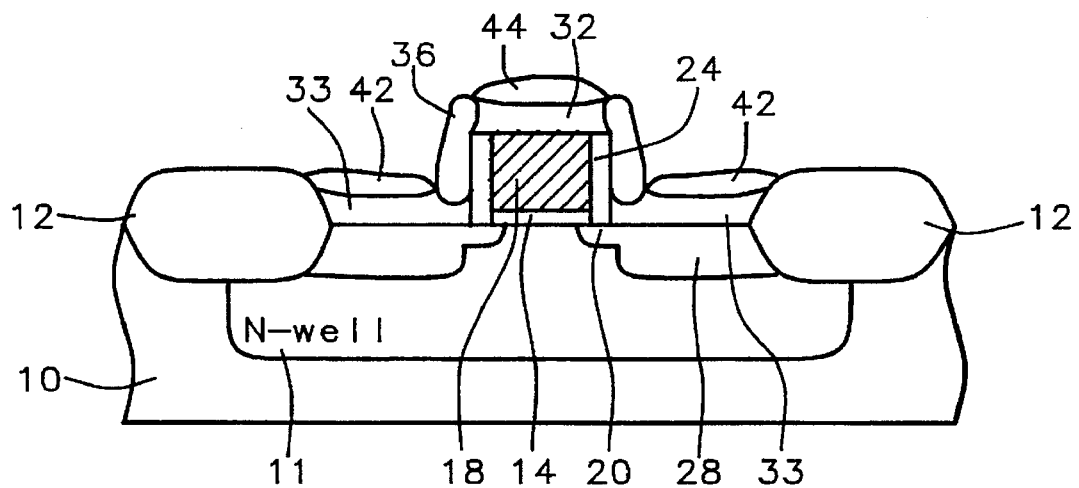

As shown in FIG. 6, the substrate is then subjected to a first rapid thermal annealed thereby forming titanium silicide 42 44 on the amorphous silicon layer over the gate electrode and over the highly doped source/drain regions. The first rapid thermal anneal of the titanium layer comprises heating the titanium layer at a temperature between about 650° and 750° C. for a time between about 30 and 60 seconds. The titanium silicide 42 44 preferably has thickness in a range of between about 400 and 800 Å. The first RTA forms C49 $TiSi_2$.

As shown in FIG. 6 the remaining unreacted titanium layer is removed, especially from over the second spacer 36. The etching of the titanium layer is preferably performed using 1:1:1 of $H_4OH$, $H_2O_2$, and $H_2O$, at a temperature between about 30° and 50° C.

The substrate is subjected to a second rapid thermal anneal (RTA) to form a salicide structure. The anneal is preferably performed at a temperature in a range of between about 800° and 900° C. for a time in a range of between about 10 and 60 seconds. The to the second RTA transforms the C49 $TiSi_2$ into C54 $TiSi_2$.

The final MOS salicide structure of the invention preferably has the following dimensions:

| Element | Low limit | High limit |
| --- | --- | --- |
| Highly doped source/drain 28 depth (beneath substrate surface) | 0.05 µm | 0.12 µm |
| Source/Drain pad thickness 33 | 30 nm | 80 nm |
| Gate pad thickness 32 | 30 nm | 80 nm |
| Titanium silicide 42 44 thickness | 40 nm | 80 nm |
| Second spacer 36 height | 2000 Å | 3000 Å |
| Second spacer 36 thickness | 75 nm | 200 nm |
| Gate electrode 18 height | 2000 Å | 3000 Å |
| Gate electrode 18 length | 0.1 µm | 0.5 µm |
| impurity concentration of the contact pads 32 33 | 5E19 atoms/cm$^3$ | 4E20 atoms/cm$^3$ |

The process of the inventions has the advantage of preventing the "bridging problem" 31 (see FIG. 1C) where a silicide layer forms over the sidewall spacers 20 thus shorting the source/drain contacts 50a 50b with the gate electrode 50c. Also, the invention provides a larger silicide anneal process window (time and temperature) because silicon diffusion over the gate spacers 24 36 and the spiking through the contact pads 32 33 is not a limiting factor. Also, the larger silicide anneal process window allows a better anneal which yields more conductive source/drain silicide contact. Moreover, the process provides higher conductivity silicide contacts (contact pads) which increase transistor performance.

The polysilicon contact pads 32 33 eliminate the spiking problems and reduce contact resistance. The polysilicon contact pads 32 33 prevent the silicide 42 44 from spiking through the thin source/drain regions 28. The contact pad also lower the contact resistance.

The present invention reduces the "narrow line effect" of Ti Silicide. As line width decreases below 0.45 µm, the silicidation becomes more difficult. Also, narrow line make silicidation more sensitive to implanted dopant. The intrinsic amorphous silicon of the invention can enhance the silicidation process.

The present invention improves the process window of contact hole etching. The invention improves the contact hole etching by increasing the thickness of $TiSi_2$ without increasing junction leakage. Therefore, more $TiSi_2$ loss can be tolerated during contact hole etching.

Although the present invention was applied to a p-type MOS transistor in the above-described embodiment, it also can be equally applied to a n type MOS transistors, or a combination of PMOS and NMOS devices, and other device types as is apparent to those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method for manufacturing a semiconductor device having a salicide structure, the method comprising the steps of:
   a) forming a gate electrode having vertical sidewalls over a semiconductor structure; said semiconductor structure having active regions on opposite sides of said gate electrode;
   b) forming lightly doped source/drain regions in said active regions;
   c) forming first sidewall spacers on said sidewalls of said gate electrode, said first sidewall spacers having sidewalls;
   d) forming highly doped source/drain regions in said active region;
   e) depositing an amorphous silicon layer over the resultant surface;
   f) patterning said amorphous silicon layer leaving said amorphous silicon layer over said sidewalls of said first sidewall spacers, and leaving said amorphous silicon layer over said highly doped source/drain regions and said gate electrode to form source/drain contact pads and gate contact pads respectively;
   g) implanting nitrogen ions into said source/drain contact pads, said gate contact pads and said amorphous silicon layer over said sidewalls of said first sidewall spacers, said nitrogen ions building up on the surface said gate contact pads and said soured drain contact pads forming a nitrogen rich layer, said nitrogen rich layer acting as an oxidation barrier over said gate electrode and said highly doped source/drain regions;
   h) oxidizing said amorphous silicon layer forming a second sidewall spacer composed of silicon oxide over said sidewalls of said first sidewall spacer, and forming an oxynitride layer over said gate contact pad and said source/drain contact pads;
   i) removing a part of said oxynitride layer over said amorphous silicon layer;
   j) depositing a titanium layer over the resultant surface;
   k) performing a first rapid thermal anneal on said semiconductor structure forming titanium silicide contacts on said gate contact pads and said source/drain contact pads; and
   l) removing the remaining titanium layer over said second sidewall spacer.

2. The method of claim 1 wherein said amorphous silicon layer has a thickness in a range of between about 300 and 800 Å.

3. The method of claim 1 wherein said oxynitride layer removed by an etch comprising $H_3PO_4$ and HF.

4. The method of claim 1 wherein said gate electrode has a height in a range of between about 2000 and 3000 Å.

5. The method of claim 1 wherein said gate insulating layer has a thickness in the range of between about 45 and 120 Å.

6. The method of claim 1 wherein said first sidewall spacers have a thickness in the range of about 1500 to 3000 Å.

7. The method of claim 1 wherein said amorphous silicon layer has a thickness in a range of between about 300 and 800 Å and an impurity concentration in a range of between about 1E20 and 4E20 atoms/cm$^3$.

8. The method of claim 1 wherein said second sidewall spacer has a width in a range of between about 600 and 1600 and a height in a range of between about 2000 and 3000 Å.

9. The method of claim 1 wherein said oxynitride layer has a thickness in a range of between about 80 and 120 Å.

10. The method of claim 1 wherein the implanting of nitrogen comprises implanting nitrogen at an energy between about 30 and 70 and a dose between about 1E15 and 3E15 ions/sq. cm.

11. The method of claim 1 wherein the first rapid thermal annealing of said titanium layer further includes heating said titanium layer at a temperature between about 650° and 750° C. for a time between about 30 and 60 seconds.

12. The method of claim 1 wherein the etching of said titanium layer includes using a 1:1:1 etch of $NH_4OH:H_2O_2:H_2O$.

13. The method of claim 1 wherein said highly doped source/drain regions have depth in a range of between about 0.05 and 0.1.2 μm, and said source/drain pad has a thickness in a range of between about 30 nm and 80 nm, and said gate contact pads have a thickness in a range of between about 30 nm and 80 nm, and said titanium silicide contact have a thickness between about 40 and 80 nm.

14. A method for manufacturing a semiconductor device having a salicide structure, the method comprising the steps of:
   a) forming a gate insulating layer on the surface of a semiconductor substrate;
   b) forming a polysilicon layer on said gate insulating layer;
   c) patterning said gate insulating layer and said polysilicon layer forming a gate electrode having vertical sidewalls;
   d) introducing impurity ions into said semiconductor substrate using said gate electrode as a mask to form lightly doped source/drain regions;
   e) forming a first insulating layer on the surface of said semiconductor substrate and on said gate electrode;
   f) anisotropic etching said first insulating layer to form first sidewall spacers on the sidewalls of said gate electrode, said sidewall spacers having sidewalls;
   g) introducing impurities into said semiconductor substrate using said gate electrode and said first sidewall spacers as a mask to form highly doped source/drain regions;
   h) rapid thermal annealing said substrate to activate said highly doped source/drain regions;
   i) depositing an amorphous silicon layer over the resultant surface;
   j) patterning said amorphous silicon layer leaving said amorphous silicon layer over said sidewalls of said first sidewall spacers, and leaving said amorphous silicon layer over said highly doped source/drain regions and said gate electrode to form source/drain contact pads and gate contact pads respectively;
   k) implanting nitrogen ions into said source/drain contact pads, said gate contact pads and said amorphous silicon layer over said sidewalls of said first sidewall spacers; said nitrogen ions building up on a surface of said source/drain contact pads and said gate contact pads forming a nitrogen rich layer, said nitrogen rich layer acting as an oxidation barrier over said gate electrode and said highly doped source/drain regions;
   l) oxidizing said amorphous silicon layer to form a second sidewall spacer composed of silicon oxide over said sidewalls of said first sidewall spacer, and to form an oxynitride layer over said gate contact pad and said source/drain contact pads;

m) removing a part of said oxynitride layer; said oxynitride layer removed by an etch comprising $H_3PO_4$ and HF;

n) depositing a titanium layer over the resultant surface;

o) performing a first rapid thermal anneal on said substrate to form a titanium silicide layer on said gate contact pads and said source/drain contact pads, p) removing a part of said titanium layer titanium layer over said silicon oxide spacer; and q) performing a second rapid thermal anneal on said substrate to form a salicide structure.

15. The method of claim 14 wherein said gate electrode has a thickness in a range of between about 2000 and 3000 Å.

16. The method of claim 14 wherein the step of patterning said first insulating film comprises forming said sidewall spacers on said sidewalls of said gate electrode and on said surface of said semiconductor substrate and in contact with said gate insulating layer.

17. The method of claim 14 wherein said gate insulating layer has a thickness in the range of about 45 to 120 Å.

18. The method of claim 14 wherein said first sidewall spacers have a thickness in the range of about 1500 to 3000 Å.

19. The method of claim 14 wherein said amorphous silicon layer has a thickness in a range of between about 300 and 800 Å.

20. The method of claim 14 wherein said second sidewall spacers have a width in a range of between about 600 and 120 and a height in a range of between about 2000 and 3000 Å.

21. The method of claim 14 wherein said oxynitride layer has a thickness in a range of between about 80 and 120 Å.

22. The method of claim 14 wherein the implanting of nitrogen comprises implanting nitrogen at an energy between about 30 and 70 and a dose between about 1E15 and 3E15 ions/sq. cm.

23. The method of claim 14 wherein the second rapid thermal anneal of the titanium layer further includes heating said titanium layer at a temperature between about 650° and 750° C. for a time between about 30 and 60 seconds.

24. The method of claim 14 wherein the removal of said titanium layer comprises an etch includes using $H_3PO_4$ and HF, at a temperature between about 30° and 50° C.

25. The method of claim 14 wherein said highly doped source/drain regions have depth in a range of between about 0.05 and 0.1.2 μm, and said source/drain pad has a thickness in a range of between about 30 nm and 80 nm, and said gate contact pads have a thickness in a range of between about 30 nm and 80 nm, and said titanium silicide contact have a thickness between about 40 and 80 nm.

* * * * *